(12) United States Patent
Khoini-Poorfard et al.

(10) Patent No.: US 6,603,804 B1
(45) Date of Patent: Aug. 5, 2003

(54) UPSAMPLING FILTER HAVING ONE-BIT MULTIPLIERS FOR MULTIPLE SPREAD-DATA STREAMS

(75) Inventors: Ramin Khoini-Poorfard, Allentown, PA (US); Lysander B. Lim, Emmaus, PA (US); Malcolm H. Smith, Macungie, PA (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 09/411,152

(22) Filed: Oct. 1, 1999

(51) Int. Cl.[7] .................. H04B 1/69; H04B 1/707; H04B 1/713
(52) U.S. Cl. .................. 375/152; 375/147; 375/150
(58) Field of Search ................. 375/152, 343, 375/142, 143, 147, 150; 370/342

(56) References Cited

U.S. PATENT DOCUMENTS 5,852,630 A * 12/1998 Langberg et al. ............ 375/219
5,956,333 A *  9/1999 Zhou et al. .................. 375/152

* cited by examiner

Primary Examiner—Stephen Chin
Assistant Examiner—Curtis Odom
(74) Attorney, Agent, or Firm—Steve Mendelsohn; Ian M. Hughes (57) ABSTRACT

A transmit portion of a WB-CDMA transceiver generates one or more spread data streams having values represented by a single bit, allowing for filtering of spread and combined data streams with a root raised cosine (RRC) filter employing single-bit multipliers. The RRC filter is a digital filter that i) employs multiplication of two values in which the length of at least one value is one bit; ii) is preferably implemented with muxs or a simple logic operator; and iii) may employ upsampling and modulation encoding of filter coefficients to reduce the coefficient length to, for example, one bit. The RRC filter may be an FIR filter having either one-bit or multi-bit coefficients, and apply RRC filtering to a spread user stream either before or after the spread user streams are combined. For some implementations, RRC filters are employed to filter each spread user stream prior to combining several processed user steams. For other implementations, the multi-bit valued data stream representing the combined user streams is upsampled to form an upsampled data stream of single-bit values, and RRC filtering is then applied to the upsampled data stream. Alternatively, implementations may use upsampled RRC filter coefficients that allow RRC filtering on the combined spread user streams represented as a sequence of multi-bit values.

30 Claims, 7 Drawing Sheets

UPSAMPLING FILTER HAVING ONE-BIT MULTIPLIERS FOR MULTIPLE SPREAD-DATA STREAMS

BACKGROUND OF THE INVENTION

1. Field of the Invention

The present invention relates to filtering spread data streams for transmission in a CDMA telecommunication system, and more particularly, to a CDMA transceiver filtering circuits with one-bit multipliers.

2. Description of the Related Art

Figure 1:
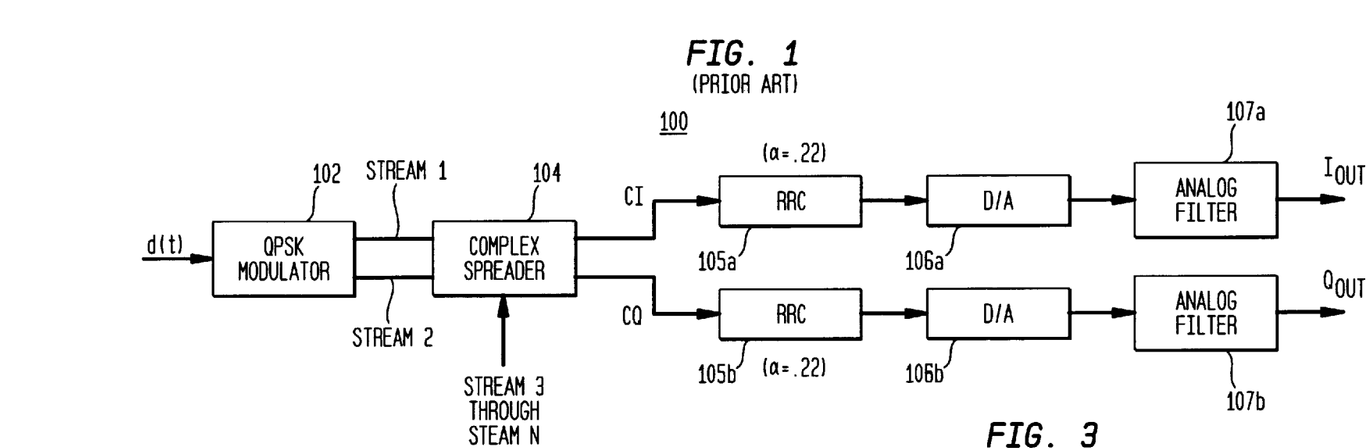
FIG. 1 shows a typical transmit portion for a transceiver as may be employed in the prior art of a WB-CDMA channel.

Wireless and cellular systems, such as wide-band, code-division, multiple-access (WB-CDMA) telecommunication systems, may support increasingly higher data rates for users. FIG. 1 shows a typical transmit portion 100 of a prior art transceiver of a WB-CDMA user channel. A single coded-data channel may comprise a 64 kbps user data stream d(t) that is QPSK modulated into in-phase (I) and quadrature-phase (Q) components. The I and Q components are user streams (e.g., STREAM 1 and STREAM 2) spread in frequency and added to user streams of other spread, coded-data channels (e.g., STREAM 3 through STREAM N) using a complex spreader 104 to form combined spread user streams CI and CQ. For systems in accordance with the WB-CDMA standard, complex spreader 104 may be a 4.096 Mbps or a 3.840 Mbps complex spreader.

The combined spread user streams CI and CQ are filtered with a pair of corresponding root raised cosine (RRC) filters 105a and 105b. The RRC filters 105a and 105b may typically be implemented with a roll-off factor a of 0.22. Implementations employing this value for a set the null-to-null bandwidth of the user channel as 4.997 MHz (4.096 MHz×(1+α)) or 4.685 MHz (3.840 MHz×(1+α)). This null-to-null bandwidth fits within the 5 MHz channel allocation of the WB-CDMA standard. The filtered digital data of the combined spread components CI and CQ are converted into corresponding analog signals by a pair of digital-to-analog converters (DACs) 106a and 106b. The analog signals generated by DACs 106a and 106b may be smoothed or otherwise shaped for transmission with corresponding analog filters 107a and 107b.

Figure 2:
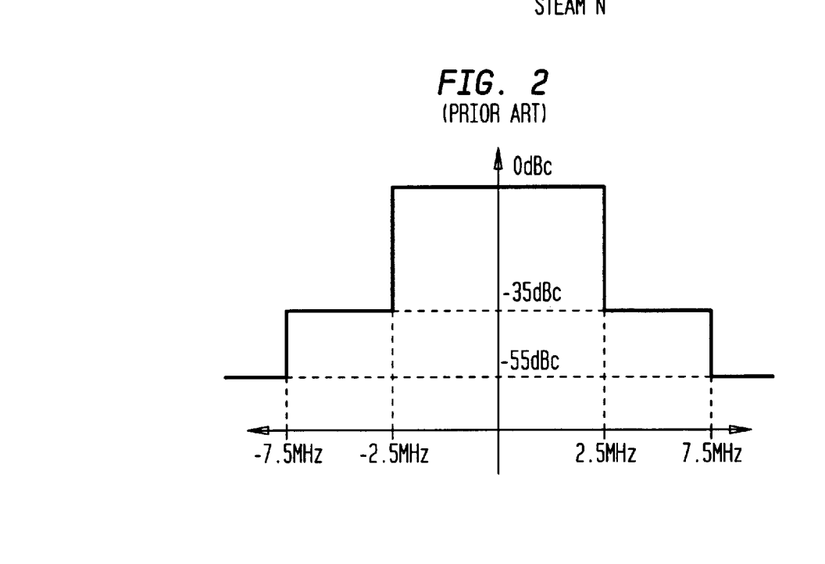
FIG. 2 shows an exemplary spectral mask of the prior art specifying emission constraints of one user's transmit channel into adjacent users' transmit channels.

Each of the RRC filters 105a and 105b may generally be implemented in the digital domain as a finite impulse response (FIR) filter and the frequency characteristics of the FIR filter may be selected as follows. The frequency domain characteristic constrains the out-of-band emissions by a transceiver transmitting in the forward transmit (Tx) channel. FIG. 2 shows an exemplary spectral mask of the prior art that specifies the emission constraints in the adjacent Tx channel as less than −35 dBc and in the alternate channels (and beyond) as less than −55 dBc. This spectral mask affects parameters such as the number of RRC filter taps and quantization bits required for implementations of the RRC filters 105a and 105b, the resolution and linearity of the DACs 106a and 106b, the corner frequency variation, order/type and linearity of the analog filters 107a and 107b.

Figure 3:
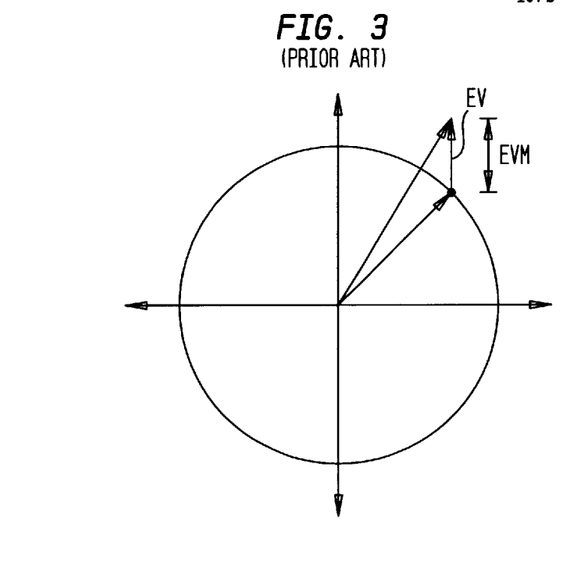
FIG. 3 shows an exemplary error vector magnitude defined by drawing the pairs of signals from the analog filters of FIG. 1 as vectors in a complex plane.

FIG. 3 shows an exemplary error vector magnitude (EVM) defined by drawing the pairs of $I_{out}$ and $Q_{out}$ vector signals from the analog filters 107a and 107b in a complex plane as vectors. Subtracting the actual $I_{out}$ and $Q_{out}$ vector signals from the ideal vectors generates the error vector (EV). EVM is the magnitude of EV. For some implementations, the root mean square (RMS) of EVM (EVMrms) is calculated over several different data bits and normalized to the length of the ideal vector. EVMrms may be expressed in percentages, and for one implementation EVMrms is less than 12.5%.

Figure 4:
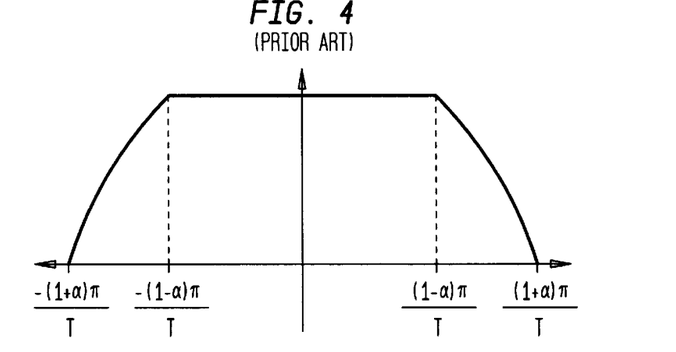
FIG. 4 shows an impulse response of an ideal RRC filter selected with an arbitrary roll-off factor.

The RRC filters 105a and 105b may be implemented as digital filters with a frequency response determined by, for example, a window-based method. The analytical equation for the impulse response of an ideal RRC filter is selected with an arbitrary roll-off factor, and such impulse response is shown in FIG. 4. The frequency response R(jω) may be calculated by evaluating the square root of a raised cosine filter. The frequency response R(Uc) is given in equation (1) in which T is the spreading chip interval (244 ns).

$$R(j\omega) = \begin{cases} 1 & 0 \le |\omega| \le \frac{(1-\alpha)\pi}{T} \\ \cos\left(\frac{T}{4\alpha}\left(|\omega| - \frac{(1-\alpha)\pi}{T}\right)\right) & \frac{(1-\alpha)\pi}{T} \le |\omega| \le \frac{(1+\alpha)\pi}{T} \\ 0 & |\omega| \ge \frac{(1+\alpha)\pi}{T} \end{cases} \quad (1)$$

The inverse Fourier transform of equation (1) is employed to determine the impulse response r(t) of the RRC filter. The impulse response r(t) may be sampled at a rate T/OSR, where OSR is the interpolation factor. The sampled impulse response r(t) may be truncated using a rectangular window based on the desired number of taps for the RRC filter.

Figure 5:
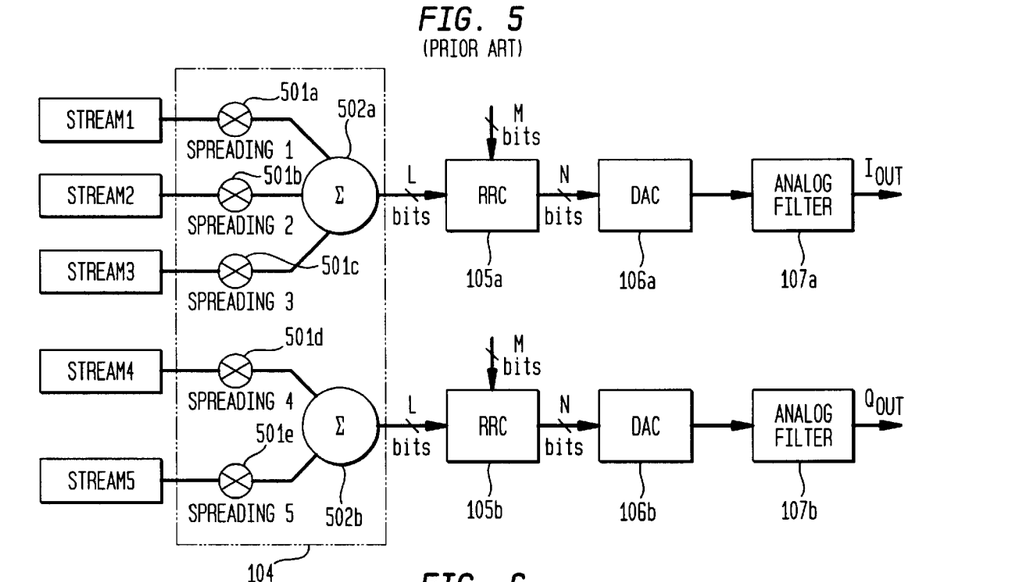
FIG. 5 shows an implementation of a baseband transmit portion of a WB-CDMA transceiver of the prior art.

FIG. 5 shows an implementation of a baseband transmit portion of a WB-CDMA transceiver such as that shown in FIG. 1. Wide-band data and multiple user data streams are received by the complex spreader 104 as STREAM 1 through STREAM 5. Each of STREAM 1 through STREAM 5 is combined with a separate corresponding spreading code (SPREADING 1 through SPREADING 5). The spread user data streams of the I-channel (and similarly, the Q-channel) are then combined into a single I-channel data stream by summer 502a. Each data stream from combiners 501a–501c has values that are one bit wide, but the output of summer 502a is a sequence of multi-bit values that are L-bits wide (L an integer greater than 1). The output stream from the summer 502a is then filtered using RRC filter 105a. As is known in the art, RRC filter 105a, when implemented as an FIR filter in the digital domain, receives filter tap coefficients that are M bits wide (M an integer greater than 1). The values of the sequence provided to the RRC filter 105a or 105b are multi-bit values, and so the RRC filter 105a or 105b includes multi-bit operations with values of the filter tap coefficients.

Figure 6:
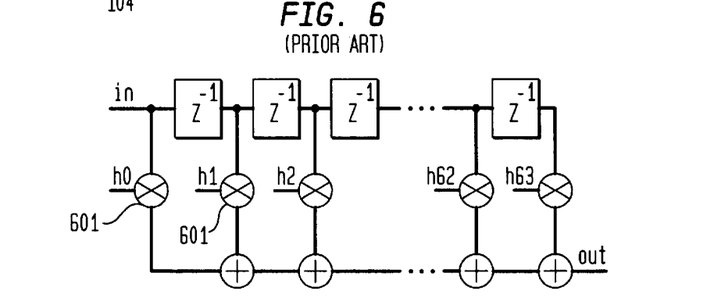
FIG. 6 shows a block diagram of the exemplary RRC filter of FIG. 5.

A block diagram of an exemplary RRC filter 105a is shown in FIG. 6. The exemplary RRC filter 105a of FIG. 6 may be a 64-tap, 10-bit resolution (coefficient) FIR filter operating (sampling) at 4 times (4×) the rate of the input data. Each of the taps of the RRC filter 105a uses a multi-bit multiplier that is as wide as the widest binary-valued coefficient or data. As the RRC filter 105a is 4 ×upsampled, one in four taps requires a 10-bit multiplier (the coefficient values for the other three of four taps is zero since zeros are inserted in the data during the upsampling process). Consequently, the exemplary RRC filter 105a employs 16 multipliers for each filter. Multi-bit multipliers each consume considerable integrated circuit area.

SUMMARY OF THE INVENTION

The present invention relates to circuits and methods for filtering a plurality of spread user data streams in which the process of filtering employs multiplication of values representing the plurality of spread user data streams, either singly or in combination, with filter coefficients, and the multiplication is a one-bit multiplication operation. In accordance with the present invention, the plurality of spread user data streams are combined, each of the spread user data streams being a sequence of one-bit values; and coefficients representing taps of the filter are applied to each of the plurality of spread user data streams. The coefficients are represented by at least one bit and applied with one-bit multiplication to values of either each or the combined plurality of spread user data streams.

The exemplary embodiments of the present invention described herein employ a filter either with single or multi-bit coefficients, and apply the filter in an operation either before or after the spread data streams are combined. The filter may be a digital filter that i) employs multiplication of two values in which the length of at least one input value is one bit; ii) is preferably implemented with muxs or a simple logic operator; and iii) may employ upsampling and modulation encoding of filter coefficients to reduce the coefficient length to, for example, one bit. For some implementations, filters are employed to filter each spread user stream prior to combining several processed user steams. For other implementations, the multi-bit valued data stream representing the combined user streams is upsampled to form an upsampled data stream of single-bit values, and a filter is then applied to filter the upsampled data stream. Alternatively, implementations may use upsampled filter coefficients that allow for use of the filter with one-bit multiplication for either single- or multi-bit values.

BRIEF DESCRIPTION OF THE DRAWINGS

Other aspects, features, and advantages of the present invention will become more fully apparent from the following detailed description, the appended claims, and the accompanying drawings in which:

DETAILED DESCRIPTION

A transmit portion of a WB-CDMA transceiver generates one or more data streams having values represented by a single bit, allowing for filtering in accordance with the present invention of spread and combined data streams with a root raised cosine (RRC) filter employing single-bit multipliers. Such RRC filter allows for multiplication of the nth filter tap having coefficient value $h_n$ by ±1. Such multiplication may be implemented by a multiplexer (mux) that selects $+h_n$ or $-h_n$ depending on the value of the data stream.

The exemplary embodiments of the present invention described herein employ the RRC filter either with single or multi-bit coefficients, and either implement the RRC filtering operation before or after the spread data streams, referred to herein as "processed user streams", are combined. As defined herein, the RRC filter is a digital filter that i) employs multiplication of two values in which the length of at least one value is one bit; ii) is preferably implemented with muxs or a simple logic operator; and iii) may employ upsampling and modulation encoding of filter coefficients to reduce the coefficient length to, for example, one bit. However, as would be apparent to one skilled in the art, the described embodiments are exemplary and various combinations of the techniques described herein may be employed. For some implementations, RRC filters are employed to filter each spread user stream prior to combining several processed user steams. For other implementations, the multi-bit valued data stream representing the combined user streams is upsampled to form an upsampled data stream of single-bit values, and a simplified RRC filter is then employed to filter the upsampled data stream. Alternatively, implementations may use upsampled RRC filter coefficients that allow for use of an RRC filter with one-bit multiplication.

Figure 7:
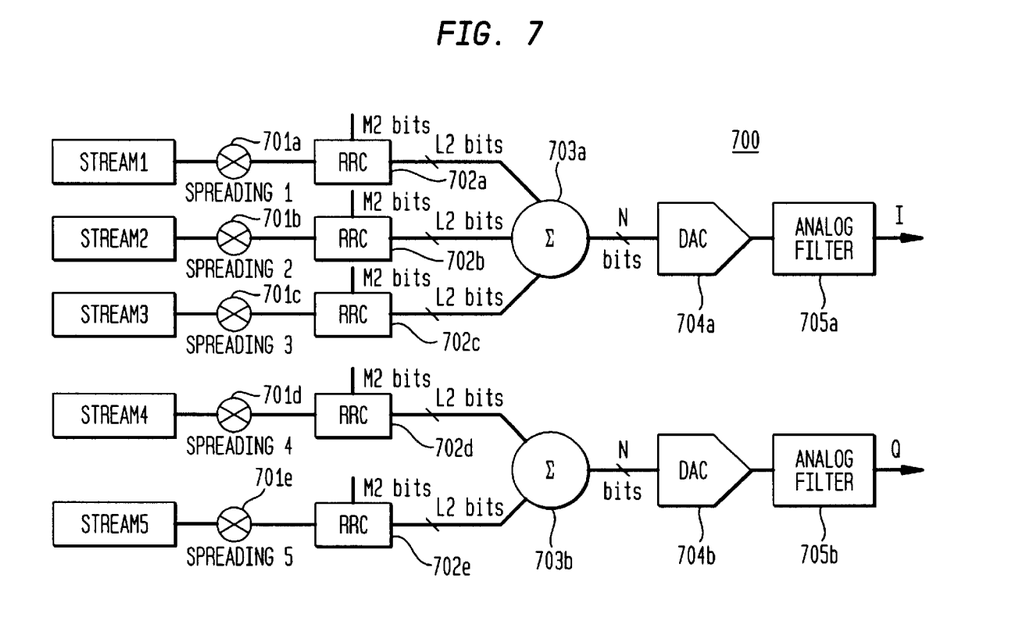
FIG. 7 shows an exemplary implementation of a transmit portion of a WB-CDMA transceiver including a simplified RRC filter in accordance with a first embodiment of the present invention.

A first embodiment of the present invention applies root-raised cosine filtering of processed user streams before summing of individual user's streams into an I-channel data stream FIG. 7 shows an exemplary implementation of a transmit portion 700 of a WB-CDMA transceiver including RRC filtering in accordance with the present invention. As shown in FIG. 7, each user stream STREAM 1 through STREAM 3 in the I-channel is spread in a corresponding combiner 701a–701c. Similarly, STREAM 4 and STREAM 5 are spread in a corresponding combiner 701d and 701e. The processed user streams are each a sequence of values, each value represented by a single bit. The following describes the first exemplary implementation for the I-channel, though as would be apparent to one skilled in the art, the Q-channel portion of the transceiver may operate in a similar manner when processed by RRC filters 702d and 702e, summer 703b, DAC 704b, and analog filter 705b.

After spreading in combiners 701a–701c, the processed user streams are filtered in respective RRC filters 702a–702c. Each of the RRC filters 702a–702c employs filter coefficients that may be multi-bit values, shown in FIG. 7 as having M2 bits (M2 an integer greater than 1). The filtered and processed user streams provided from RRC filters 702a–702c each have multi-bit values, shown as L2 bits(L2 an integer greater than 1), that are combined in summer 703a to provide the I-channel data stream having N-bit values(N an integer greater than 1).

The I-channel data stream of N-bit values is converted from a digital signal to an analog signal by digital-to-analog converter (DAC) 704a. The I-channel analog signal may be further filtered in the analog filter 705a to reduce, for example, quantization noise added by the operation of DAC 704a. As would be apparent to one skilled in the art, selection of the length of coefficients, upsampling and upsampling rates, and other operations of the transmit portion may be selected based on limitations of the speed of the operation of DAC 704a.

Figure 8:
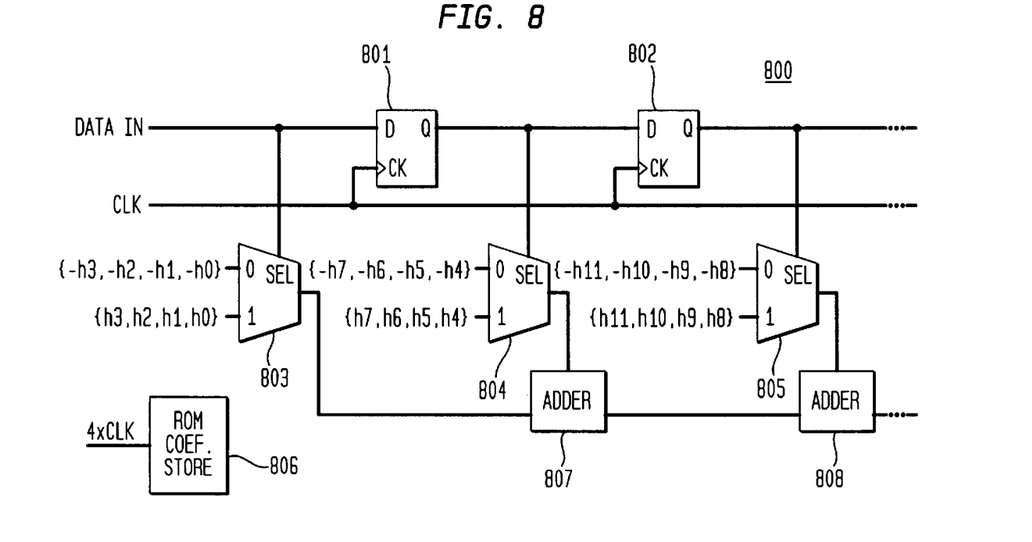
FIG. 8 shows two stages of an exemplary circuit for an RRC filter of FIG. 7 operating in accordance with a 4x-upsampled filtering operation.

Since RRC filtering with a finite impulse response filter (FIR) is a linear operation, filtering before combining the processed user streams provides a signal equivalent to the signal formed by filtering after combining the processed user streams. Each RRC filter 702a operates on the stream of one-bit values with coefficient multiplication by muxs and filter delay elements implemented with latches. For an exemplary operation, the transmit portion may employ upsampling of the processed user stream by 4 times the base bit rate (i.e., 4 ×upsampling) of the processed user stream (i.e., data at the spreading chip rate). For the RRC filtering operation with 4 ×upsampling, the circuit for one of the RRC filters 702a–702c may comprise 16 latches and 16 muxs. FIG. 8 shows two stages of an RRC filter 702 operating in accordance with 4 ×upsampling operation. Each latch 801 and 802 is clocked (using the signal CLK) at the same rate as the processed user stream. The filter coefficients are provided from a coefficient storage (e.g., a ROM) to muxs 803, 804, and 805 at 4 ×the data rate (using signal 4 ×CLK). Consequently, the bit value for a path (either input to mux 801 or output from latches 801 and 802) is used 4 times. The value for a path is used 4 times to sequentially select a coefficient or the coefficient's complement (i.e., the coefficient of a tap corresponding to one of the four clock cycles at 4×CLK) before the next bit value of processed user data is clocked into RRC filter 702. The output of each of the muxs 803, 804, and 805 is then summed in corresponding adders 807 and 808.

Figure 9:
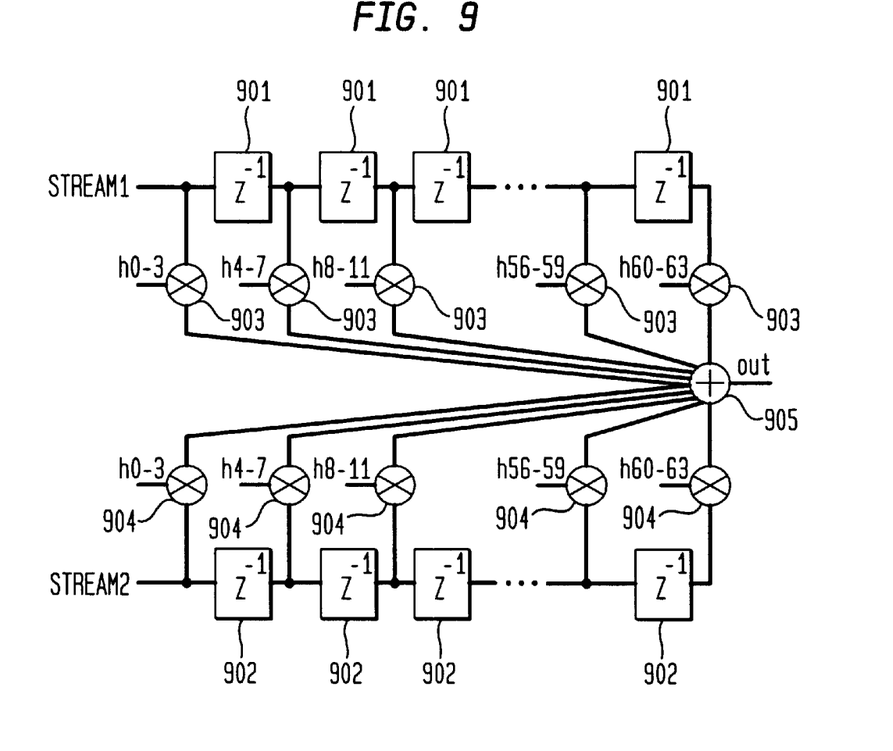
FIG. 9 shows an exemplary circuit combining the operation in FIG. 7 of adders in RRC filters with the summing of the filtered and processed user streams.

Returning to FIG. 7 the output sequence value of each RRC filter 702a–702c is summed. Consequently, the output of summer 703a is the sum of the filter tap values (selected coefficients or their complements) of RRC filters 702a–702c. FIG. 9 shows a circuit that combines the summing operation of the adders (e.g., adders 807 and 808 of FIG. 8) of the RRC filters 702 with the summing operation of the summer 703a of the filtered and processed user streams. The first processed user stream (STREAM 1) is clocked into latches 901, and coefficients selected by muxs 903, with coefficients provided to muxs 903 at 4 ×the data rate of the processed user stream. Similarly, the second processed user stream (STREAM 2) is clocked into latches 902, and coefficients selected by muxs 904, with coefficients provided to muxs 904 at 4 ×the data rate of the processed user stream. Although preferred embodiments may employ the same filter coefficients for each processed user stream, the present invention is not so limited. The circuit of FIG. 9 is shown combining two processed user streams using adder 905, but one skilled in the art could readily extend the circuit of FIG. 9 to combine several processed user streams.

Figure 10:
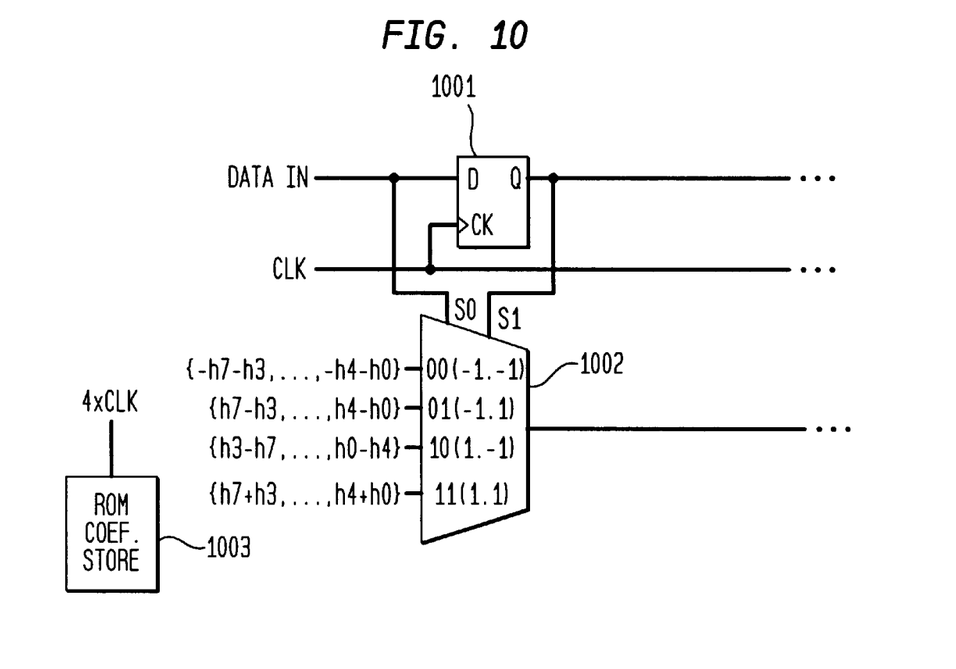
FIG. 10 shows a stage of an exemplary implementation of an RRC filter of FIG. 7 comprising a 4-to-1 mux, latch, and coefficient storage.

To further reduce circuit complexity of the circuit shown in FIG. 8, for example, the operations of two taps of the RRC filter may be combined into one operation using a 4-to-1 mux. FIG. 10 shows an exemplary circuit of stages of an RRC filter that comprises a 4-to-1 mux 1002, latch 1001, and coefficient storage 1003. The 4-to-1 mux 1002 selects a corresponding sum of the coefficient values based on both the input and output data values of latch 1001. The exemplary circuit of FIG. 10, similar to the circuit of FIG. 8, operates the 4-to-1 mux 1002 with clock signal frequency 4×CLK (4 ×the rate of the processed user stream at CLK rate) and provides coefficients from storage 1003 at the 4×CLK frequency. As would be apparent to one skilled in the art, combining such operation of filter taps may be extended, such as combining the operation of 3 filter taps using an 8-to-1 mux or combining the operation of 4 filter taps using a 16-to-1 mux.

An second embodiment of the present invention further simplifies operation of root-raised cosine filtering by upsampling of both processed user streams and coefficients of the RRC filter taps. For implementations of such second embodiment, reduced circuit complexity may result from one-bit by one-bit multiplication since the number of accumulators (adders and summers) and multi-bit storage registers of an implementation may be reduced. However, reduced circuit complexity is a result of upsampling of the processed user streams but operations on the upsampled, processed user streams may require higher overall processing speed of the transceiver.

Figure 11:
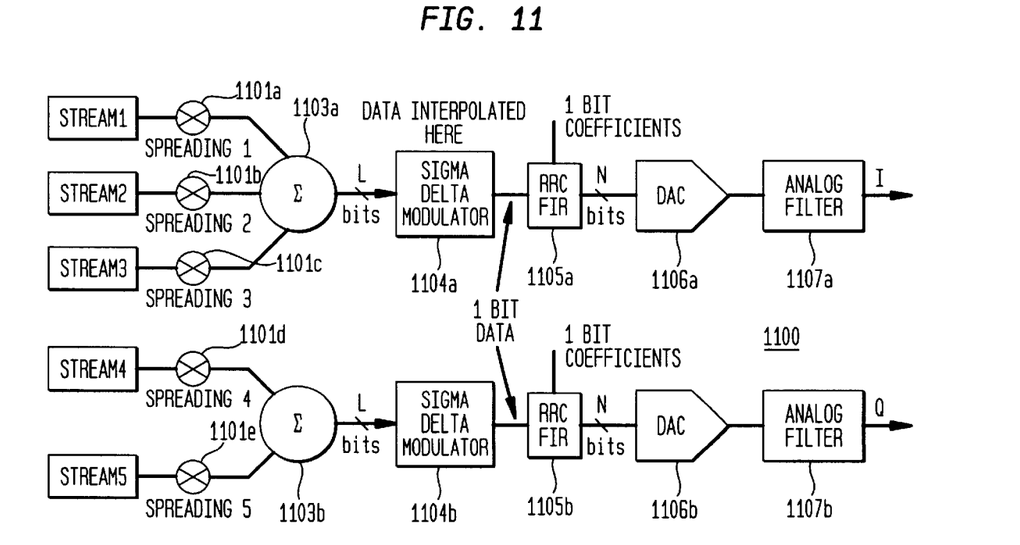
FIG. 11 shows an exemplary implementation of a transmit portion of a WB-CDMA transceiver including an RRC filter in accordance with a second embodiment of the present invention.

"FIG. 11 shows an exemplary implementation 1100 of a transmit portion of a WB-CDMA transceiver including a simplified RRC filter in accordance with the second embodiment of the present invention. As shown in FIG. 11, each user stream STREAM 1 through STREAM 3 in the I-channel is spread in a corresponding combiner 1101a–1101c. Similarly, STREAM 4 and STREAM 5 are spread in a corresponding combiner 1101d and 1101e. Each processed user stream from a corresponding one of combiners 1101a–1101e is a sequence of values, with each value represented by a single bit. The following describes the first exemplary implementation for the I-channel, though as would be apparent to one skilled in the art, the Q-channel portion of the transceiver may operate in a similar manner when processed by summer 1103b, sigma delta modulator 1104b, RRC filter 1105b, DAC 1106b, and analog filter 1107b. After spreading in combiners 701a–701c, the processed user streams are then combined in summer 1103a to provide the I-channel data stream having L-bit values, L an integer greater than 1."

The I-channel data stream of L-bit values are upsampled (interpolated) and provided to sigma delta modulator 1104a. The sigma delta modulator 1104a encodes the upsampled I-channel data stream of L-bit values into an output stream of one bit values. The output stream of the sigma delta modulator 1104a is provided to RRC filter 1105a. RRC filter 1105a multiplies the sequence of one-bit values by corresponding one-bit coefficients. The one-bit coefficients are previously calculated from upsampled and one-bit encoded (e.g., sigma-delta modulated) multi-bit coefficients corresponding to the FIR RRC filter taps. The one-bit coefficients are desirably stored in a ROM (not shown in FIG. 11).

The output sequence of the RRC filter 1105a is converted from a digital signal to an analog signal by digital-to-analog converter (DAC) 1106a. The (I-channel) analog signal provided by DAC 1106*a* may be further filtered in analog filter 1107*a* to reduce, for example, quantization noise added by the operation of DAC 1106*a*. As would be apparent to one skilled in the art, selection of the length of coefficients, upsampling rates, and other operations of the transmit portion may be selected based on processing speed limitations of DAC 1106*a*.

RRC filter 1105*a* operates on one-bit I-channel data values and on one-bit coefficients. Operating on both one-bit data and one-bit coefficient values may allow for reduced circuit complexity since one-bit by one-bit multiplication for each filter tap may only require a latch and a logic gate. The results from each tap may then be accumulated with one or more adders. The one-bit I-channel data and one-bit coefficients may have values +1 and −1, and by using the '0' logic level to represent −1 and the '1' logic level to represent +1, an XNOR logic operation may be employed to implement the one-bit by one-bit multiplication. (see Table 1).

TABLE 1

| Data | Coefficient | Result |
|------|-------------|--------|
| 0 (−1) | 0 (−1) | 1 (1) |
| 0 (−1) | 1 (1) | 0 (−1) |
| 1 (1) | 0 (−1) | 0 (−1) |
| 1 (1) | 1 (1) | 1 (1) |

For the circuit 1100 of FIG. 11, sigma-delta modulator 1104*a* may typically operate with high processing speed and may add circuit complexity. The rate of upsampling is related to the processing speed of circuit 1100 and is also related to the order of modulation employed in sigma-delta modulator 1104. If analog filter 1107*a* is used, the order of analog filter 1107 may preferably be at least one order higher than the order of the order of modulation employed in sigma-delta modulator 1104 to enable analog filter 1107*a* to reduce noise added by modulation (one-bit encoding) of the I-channel data stream. For particular implementations, limitations of analog components used may limit the degree of modulation, and hence, the upsampling ratio.

Figure 12:
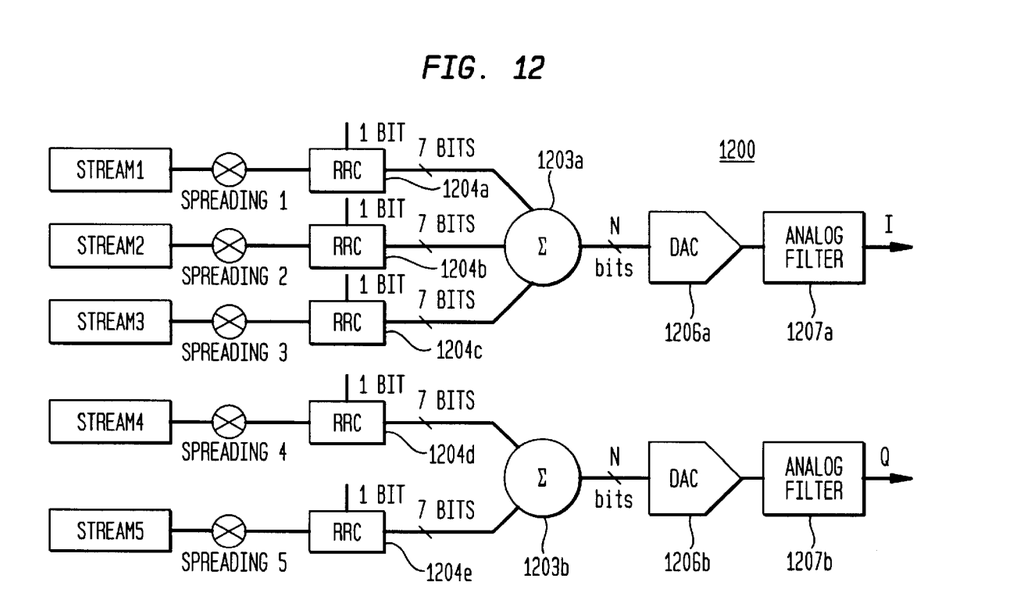
FIG. 12 shows an alternative implementation of the circuit of FIG. 11 that applies each processed user stream to an RRC filter prior to their combination into an I-channel data stream.

"The circuit of FIG. 11 may be modified to employ an RRC filter for each processed user stream before combining all the processed user streams together. FIG. 12 shows an alternative implementation 1200 that includes RRC filtering of each processed user stream before combining them into an I-channel data stream. Although preferred embodiments may employ the same RRC filter (i.e., the same coefficient values) for filtering of each processed user stream, the present invention is not so limited. Each of the RRC filters 1204*a*–1204*e* includes one-bit by one-bit multiplication similar to that of RRC filter 1105 of FIG. 11. The output values from each of the RRC filters 1204*a*–1204*e* may be seven bits wide as 64 one-bit taps are summed (six bits and a carry bit). For the circuit 1200, of FIG. 12, the RRC filters 1204*a*–1204*e*, the summers 1203*a* and 1203*b*, DACs 1206*a* and 1206*b*, and analog filters 1207*a* and 1207*b* operate with higher processing speed. For exemplary implementations of circuits 1100 and 1200, RRC filtering using 4 xupsampling may require an analog filter for DACs 1206*a* and 1206*b* that is a fourth order Butterworth filter. Consequently, third order modulation by the sigma-delta modulator may require, overall, a 16 xupsampling ratio."

Figure 13:
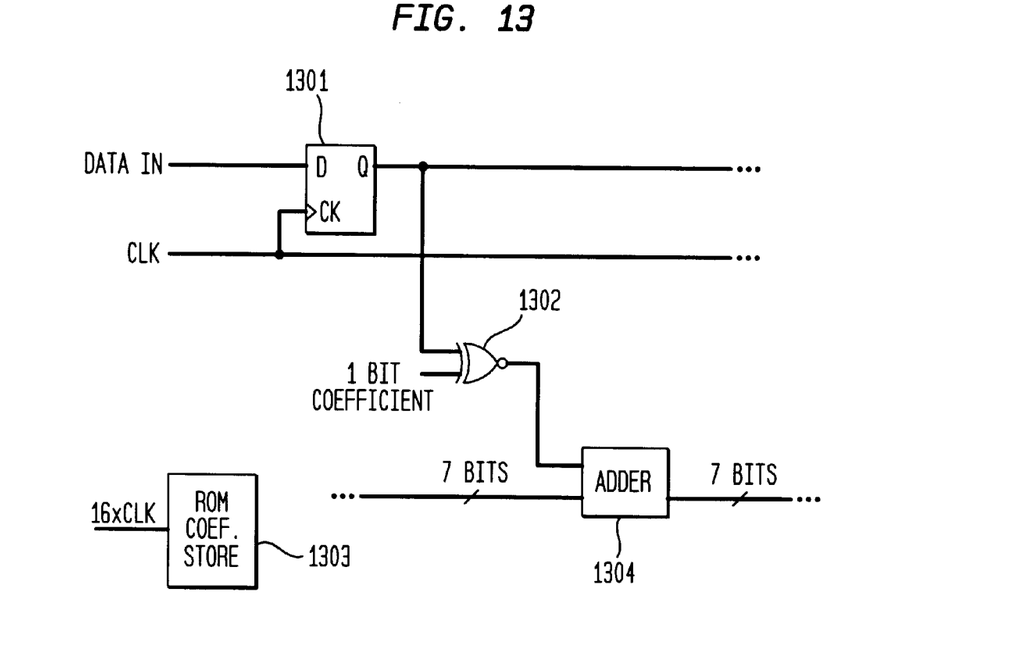
FIG. 13 shows an exemplary implementation of a stage of an RRC filter of either FIG. 11 or FIG. 12 operating in accordance with 4x-upsampled filtering operation.

FIG. 13 shows a stage of RRC filter 1105 and/or 1204 operating in accordance with 4x-upsampled filtering. Latch 1301 is clocked (using the signal CLK) at the same rate as the 20 processed user stream. The RRC filter tap one-bit coefficients are provided from a coefficient storage 1303 (e.g., a ROM) to XNOR 1302 at 16 xthe data rate (using signal 16xCLK). Consequently, the output of XNOR 1302 may be based on coefficient and data values as given previously in Table 1. The output of XNOR 1302 and the accumulated values of previous taps are summed in corresponding adder 1304.

Figure 14:
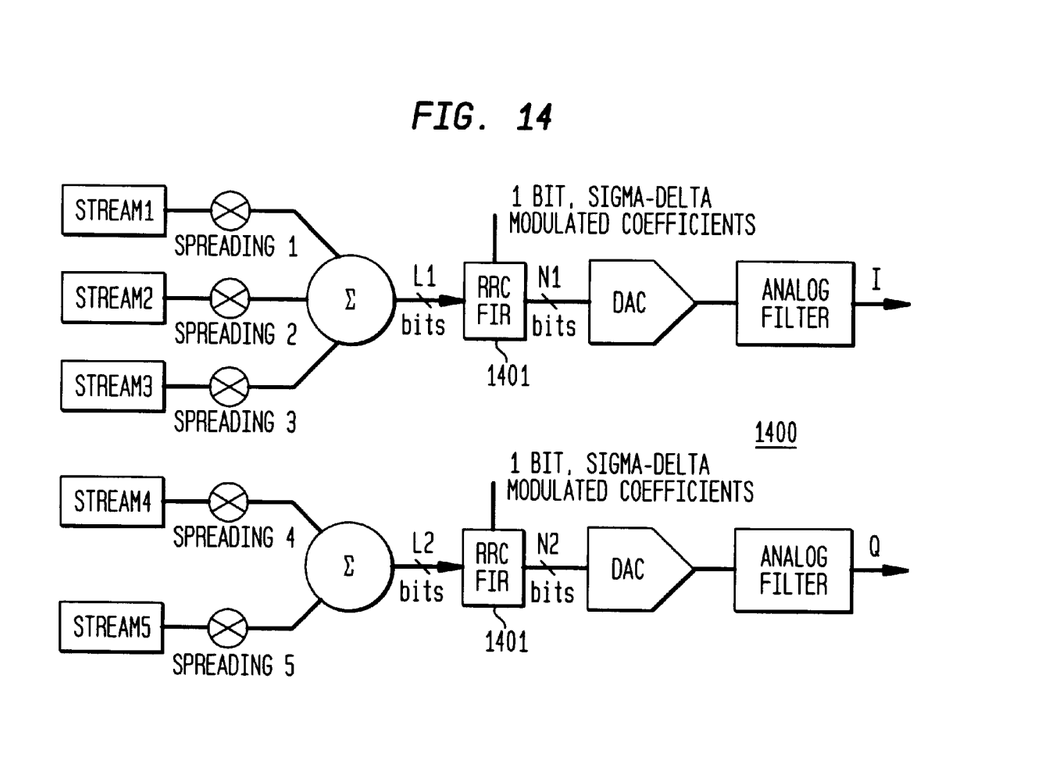
FIG. 14 shows an exemplary implementation of a transmit portion of a WB-CDMA transceiver including an RRC filter in accordance with a third embodiment of the present invention.
Figure 15:
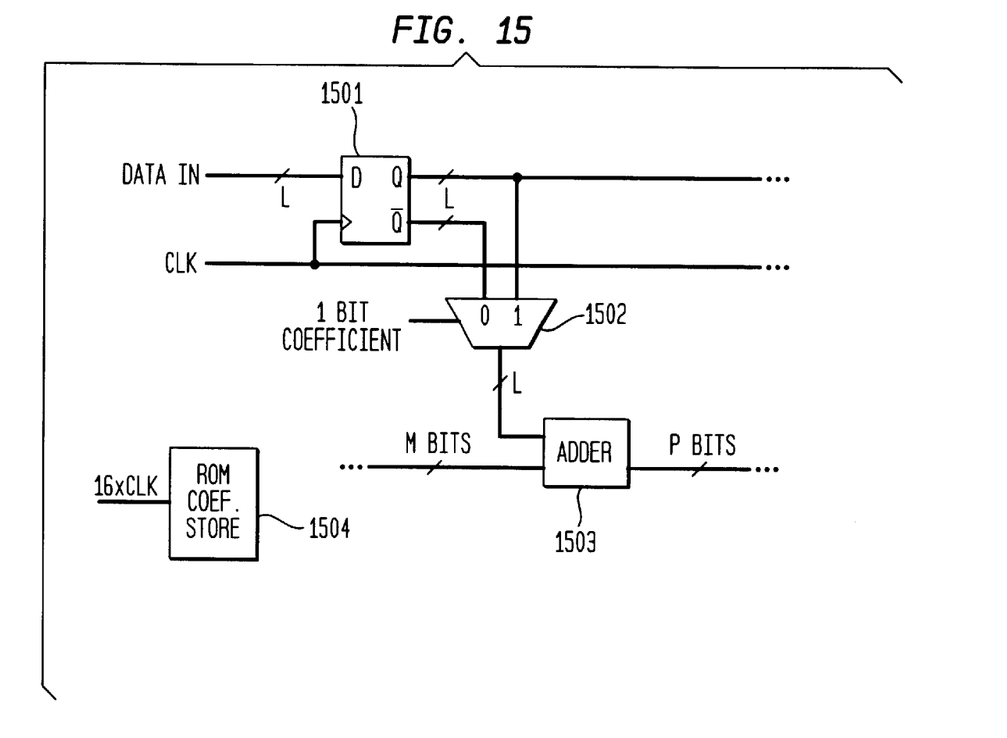
FIG. 15 shows a stage of the RRC filter of FIG. 14 using a mux that selects a data stream value stored in a latch and based on the sign of a coefficient.

For a third embodiment of the present invention, the processed user streams are combined and then the combined processed user streams are RRC filtered using one-bit coefficients. As described previously, the one-bit coefficients of filter taps are calculated from multi-bit coefficients by upsampling and applying sigma-delta modulation for one-bit encoding. The one-bit coefficients may be stored in a coefficient memory. As shown in FIG. 14, an exemplary implementation 1400 of the third embodiment includes RRC filter 1401 applying one-bit coefficients to the multi-bit values of the I-channel data stream. For the exemplary implementation 1400, the multiplication function of RRC filter 1401 may be implemented as shown in FIG. 15. FIG. 15 shows a stage (filter tap) of the RRC filter 1401 using a mux 1502 that selects for output, based on the sign of the coefficient, either the data stream value or the inverse of the data stream value that is stored in latch 1501. For an RRC filter that operates with 4 xupsampling using third order modulation of coefficients, the one-bit coefficients are provided from coefficient memory 1504 at 16 xthe clock rate CLK of the I-channel data stream (i.e., at 16xCLK). The selected value from latch 1501 is then summed in adder 1503 with the accumulated values from previous stages (filter taps).

While the exemplary embodiments of the present invention have been described with respect to processes of circuits, the present invention is not so limited. As would be apparent to one skilled in the art, various functions of circuit elements may also be implemented in the digital domain as processing steps in a software program. Such software may be employed in, for example, a digital signal processor, micro-controller or general purpose computer.

The present invention can be embodied in the form of methods and apparatuses for practicing those methods. The present invention can also be embodied in the form of program code embodied in tangible media, such as floppy diskettes, CD-ROMs, hard drives, or any other machine-readable storage medium, wherein, when the program code is loaded into and executed by a machine, such as a computer, the machine becomes an apparatus for practicing the invention. The present invention can also be embodied in the form of program code, for example, whether stored in a storage medium, loaded into and/or executed by a machine, or transmitted over some transmission medium, such as over electrical wiring or cabling, through fiber optics, or via electromagnetic radiation, wherein, when the program code is loaded into and executed by a machine, such as a computer, the machine becomes an apparatus for practicing the invention. When implemented on a general-purpose processor, the program code segments combine with the processor to provide a unique device that operates analogously to specific logic circuits.

It will be further understood that various changes in the details, materials, and arrangements of the parts which have been described and illustrated in order to explain the nature of this invention may be made by those skilled in the art without departing from the principle and scope of the invention as expressed in the following claims.

What is claimed is:

1. A method of applying a filter to a plurality of spread user data streams comprising the steps of:
   a) combining the plurality of spread user data streams, each of the spread user data streams being a sequence of one-bit values; and
   b) applying coefficients representing taps of the filter to each of the plurality of spread user data streams, the coefficients being represented by at least one bit and applied with one-bit multiplication to values of either i) each of the or ii) the combined plurality of spread user data streams.

2. The invention as recited in claim 1, wherein the coefficients are applied to each of the plurality of spread user data streams before the plurality of user data streams are combined in step a).

3. The invention as recited in claim 1, wherein, for step b), the coefficients are upsampled and one-bit encoded multi-bit coefficients of the filter.

4. The invention as recited in claim 3, wherein the coefficients are applied to each spread user data stream before the plurality of user data streams are combined in step a).

5. The invention as recited in claim 3, wherein the plurality of spread user data streams are combined in step a) to form a channel data stream represented by a sequence of multi-bit values and for step b) the coefficients are applied to the multi-bit values of the channel data stream of step a).

6. The invention as recited in claim 1, wherein steps a) and b) are applied within a transmit circuit operating in accordance with a wide-band, code-division, multiple-access telecommunication standard.

7. A circuit for applying a filter to a plurality of spread user data streams comprising:
   a combiner for combining the plurality of spread user data streams, each of the spread user data streams being a sequence of one-bit values; and
   a filter comprising a plurality of one-bit multipliers, each multiplier applying a coefficient corresponding to a filter tap to one or more values of each of the plurality of spread user data streams,
   wherein each coefficient is represented by at least one bit and is applied with one-bit multiplication to values of either each or the combined plurality of spread user data streams.

8. The invention as recited in claim 7, wherein the filter applies one or more coefficients to the one-bit values of each spread user data stream before the plurality of user data streams are combined by the combiner.

9. The invention as recited in claim 7, wherein, each coefficient is an upsampled and one-bit encoded multi-bit coefficient for the tap of the filter.

10. The invention as recited in claim 9, wherein the plurality of spread user data streams are combined by the combiner to form a channel data stream represented by a sequence of multi-bit values, and the coefficients of the filter are applied to the multi-bit values of the channel data stream.

11. The invention as recited in claim 7, wherein the circuit is embodied in an integrated circuit.

12. The invention as recited in claim 11, wherein the integrated circuit is included in a transceiver operating in accordance with a wide-band code-division, multiple-access telecommunication standard.

13. A computer-readable medium having stored thereon a plurality of instructions, the plurality of instructions including instructions which, when executed by a processor, cause the processor to implement a method for applying a filter to a plurality of spread user data streams, the method comprising the steps of:
   a) combining the plurality of spread user data streams, each of the spread user data streams being a sequence of one-bit values; and
   b) applying coefficients representing taps of the filter to each of the plurality of spread user data streams, the coefficients being represented by at least one bit and applied with one-bit multiplication to values of either each or the combined plurality of spread user data streams.

14. The invention as recited in claim 13, wherein the coefficients are applied to each spread user data stream before the plurality of user data streams are combined in step a).

15. The invention as recited in claim 13, wherein, for step b), the coefficients are upsampled and one-bit encoded multi-bit coefficients of the filter.

16. The invention as recited in claim 15, wherein the coefficients are applied to each spread user data stream before the plurality of user data streams are combined in step a).

17. The invention as recited in claim 15, wherein the plurality of spread user data streams are combined in step a) to form a channel data stream represented by a sequence of multi-bit values and for step b) the coefficients are applied to the multi-bit values of the channel data stream of step a).

18. An apparatus for applying a filter to a plurality of spread user data streams comprising:
   first combining means for combining the plurality of spread user data streams, each of the spread user data streams being a sequence of one-bit values; and
   second combining means for applying coefficients representing taps of the filter to each of the plurality of spread user data streams, the coefficients being represented by at least one bit and applied with one-bit multiplication to values of either each or the combined plurality of spread user data streams.

19. The invention as recited in claim 18, wherein the second combining means applies one or more coefficients to the one-bit values of each spread user data stream before the plurality of user data streams are combined by the first combining means.

20. The invention as recited in claim 18, wherein the coefficients are upsampled and one-bit encoded multi-bit coefficients of the filter.

21. The invention as recited in claim 20, wherein the second combining means applies coefficients to each spread user data stream before the plurality of user data streams are combined by the first combining means.

22. The invention as recited in claim 20, wherein the first combining means combines the plurality of spread user data streams to form a channel data stream represented by a sequence of multi-bit values; and the second combining means applies the coefficients to the multi-bit values of the channel data stream.

23. A method of applying a filter to a plurality of spread user data streams comprising the steps of:
   a) combining the plurality of spread user data streams, each of the spread user data streams being a sequence of one-bit values, wherein the combined plurality of spread user data streams form a channel data stream, and wherein step a) comprises the steps of:
      a1) upsampling the channel data stream, and
      a2) one-bit encoding the channel data stream into a sequence of one-bit values; and
   b) applying coefficients representing taps of the filter to the sequence of one-bit values representing the channel data stream, the coefficients being represented by at least one bit and applied with one-bit multiplication to values of either i) each of the or ii) the combined plurality of spread user data streams.

24. A method of applying a filter to a plurality of spread user data streams comprising the steps of:
   a) combining the plurality of spread user data streams, each of the spread user data streams being a sequence of one-bit values; and b) applying coefficients representing taps of the filter to each of the plurality of spread user data streams, wherein the coefficients represent taps of a root-raised cosine filter, being represented by at least one bit, and applied with one-bit multiplication to values of either i) each of the or ii) the combined plurality of spread user data streams.

25. A circuit for applying a filter to a plurality of spread user data streams comprising:

a combiner for combining the plurality of spread user data streams, each of the spread user data streams being a sequence of one-bit values; and a filter comprising a plurality of one-bit multipliers, each multiplier applying a coefficient corresponding to a filter tap to one or more values of each of the plurality of spread user data streams, wherein each coefficient is an upsampled and one-bit encoded multi-bit coefficient for the tap of the filter, is represented by at least one bit, and is applied with one-bit multiplication to values of either each or the combined plurality of spread user data streams, and wherein the filter comprises a set of separate filters, and each separate filter applies one or more coefficients to one-bit values of a corresponding spread user data stream, and each output value of a separate filter is applied to the combined to combine the filtered plurality of spread user data streams.

26. A circuit for applying a filter to a plurality of spread user data streams comprising:

a combiner for combining the plurality of spread user data streams, each of the spread user data streams being a sequence of one-bit values; and a filter comprising a plurality of one-bit multipliers, each multiplier applying a coefficient corresponding to a filter tap to one or more values of each of the plurality of spread user data streams, wherein each coefficient is represented by at least one bit and is applied with one-bit multiplication to values of either each or the combined plurality of spread user data streams, and wherein the combined plurality of spread user data streams form a channel data stream; and the circuit further comprises a modulator for upsampling and one-bit encoding the channel data stream into a sequence of one-bit values; and the filter applies the coefficients to the sequence of one-bit values representing the channel data stream.

27. A computer-readable medium having stored thereon a plurality of instructions, the plurality of instructions including instructions which, when executed by a processor, cause the processor to implement a method for applying a filter to a plurality of spread user data streams, the method comprising the steps of:

a) combining the plurality of spread user data streams, each of the spread user data streams being a sequence of one-bit values, wherein the combined plurality of spread user data streams form a channel data stream, and wherein step a) comprises the steps of:

a1) upsampling the channel data stream, and a2) one-bit encoding the channel data stream into a sequence of one-bit values; and b) applying coefficients representing taps of the filter to the sequence of one-bit values representing the channel data stream, the coefficients being represented by at least one bit and applied with one-bit multiplication to values of either i) each of the or ii) the combined plurality of spread user data streams.

28. A computer-readable medium having stored thereon a plurality of instructions, the plurality of instructions including instructions which, when executed by a processor, cause the processor to implement a method for applying a filter to a plurality of spread user data streams, the method comprising the steps of:

a) combining the plurality of spread user data streams, each of the spread user data streams being a sequence of one-bit values; and b) applying coefficients representing taps of the filter to each of the plurality of spread user data streams, wherein the coefficients represent taps of a root-raised cosine filter, being represented by at least one bit, and applied with one-bit multiplication to values of either i) each of the or ii) the combined plurality of spread user data streams.

29. An apparatus for applying a filter to a plurality of spread user data streams comprising:

first combining means for combining the plurality of spread user data streams, each of the spread user data streams being a sequence of one-bit values; and second combining means for applying coefficients representing taps of the filter to each of the plurality of spread user data streams, the coefficients being represented by at least one bit and applied with one-bit multiplication to values of either each or the combined plurality of spread user data streams, wherein the combined plurality of spread user data streams form a channel data stream, and the first combining means includes means for upsampling and one-bit encoding the channel data stream into a sequence of one-bit values, and wherein the second combining means applies the coefficients to the sequence of one-bit values representing the channel data stream.

30. An apparatus for applying a filter to a plurality of spread user data streams comprising:

first combining means for combining the plurality of spread user data streams, each of the spread user data streams being a sequence of one-bit values; and second combining means for applying coefficients representing taps of the filter to each of the plurality of spread user data streams, the coefficients being represented by at least one bit and applied with one-bit multiplication to values of either each or the combined plurality of spread user data streams, wherein the coefficients of the filter represent values for taps of a root-raised cosine filter.

* * * * *